(12) United States Patent
Park et al.

(10) Patent No.: US 6,962,856 B2
(45) Date of Patent: Nov. 8, 2005

(54) METHOD FOR FORMING DEVICE ISOLATION FILM OF SEMICONDUCTOR DEVICE

(75) Inventors: Cheol Hwan Park, Seoul (KR); Dong Su Park, Gyeonggi-do (KR); Tae Hyeok Lee, Gyeonggi-do (KR); Sang Ho Woo, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 10/600,332

(22) Filed: Jun. 23, 2003

(65) Prior Publication Data

US 2004/0082144 A1    Apr. 29, 2004

(30) Foreign Application Priority Data

Jul. 19, 2002   (KR) ..................... 10-2002-0042462

(51) Int. Cl.[7] .............................................. H01L 21/76
(52) U.S. Cl. ...................... 438/424; 438/431; 438/435
(58) Field of Search ........................... 438/42, 207, 218, 438/221, 296, 359, 424, 431, 435

(56) References Cited

U.S. PATENT DOCUMENTS

| | | | | |
|---|---|---|---|---|
| 4,571,819 A | * | 2/1986 | Rogers et al. | 438/430 |
| 4,871,689 A | * | 10/1989 | Bergami et al. | 438/427 |
| 5,189,501 A | * | 2/1993 | Kawamura et al. | 257/647 |
| 5,190,889 A | * | 3/1993 | Poon et al. | 438/437 |
| 5,763,315 A | * | 6/1998 | Benedict et al. | 438/424 |
| 6,046,487 A | * | 4/2000 | Benedict et al. | 257/510 |
| 6,140,208 A | * | 10/2000 | Agahi et al. | 438/437 |
| 6,146,974 A | * | 11/2000 | Liu et al. | 438/435 |
| 6,165,854 A | * | 12/2000 | Wu | 438/296 |
| 6,200,881 B1 | * | 3/2001 | Lou | 438/424 |
| 6,255,176 B1 | * | 7/2001 | Kim et al. | 438/296 |
| 6,255,194 B1 | * | 7/2001 | Hong | 438/435 |
| 6,326,282 B1 | * | 12/2001 | Park et al. | 438/424 |
| 6,426,272 B1 | * | 7/2002 | Fu et al. | 438/435 |
| 6,461,937 B1 | * | 10/2002 | Kim et al. | 438/431 |
| 6,482,715 B2 | * | 11/2002 | Park et al. | 438/424 |
| 6,717,231 B2 | * | 4/2004 | Kim et al. | 257/510 |

(Continued)

FOREIGN PATENT DOCUMENTS

KR    20010106956    12/2001

*Primary Examiner*—Lynne A. Gurley
*Assistant Examiner*—Stanetta Isaac
(74) *Attorney, Agent, or Firm*—Jacobson Holman PLLC (57) ABSTRACT

A method for forming a device isolation film of a semiconductor device, wherein an annealing process is performed on the oxide film using NH3 prior to the deposition of a liner nitride film and after the deposition of a thermal oxide film on a sidewall of a trench to nitridate the oxide film is disclosed. The method comprises the steps of: (a) sequentially forming a pad oxide film and a pad nitride film on a semiconductor substrate; (b) selectively etching the pad nitride film to form a nitride film pattern; (c) etching the pad oxide film and a predetermined thickness of the semiconductor substrate using the nitride film pattern as a hard mask to form a trench; (d) forming a thermal oxide film on the surface of the trench; (e) performing an annealing process under NH3 atmosphere to form an oxide nitride film on the surface of the thermal oxide film; (f) forming a liner nitride film on the entire surface; (g) forming an oxide film filling the trench on the entire surface; and (h) performing a planarization process.

11 Claims, 7 Drawing Sheets

U.S. PATENT DOCUMENTS

| | | | |
|---|---|---|---|
| 6,727,159 B2 * | 4/2004 | Chen et al. | 438/435 |
| 6,734,082 B2 * | 5/2004 | Zheng et al. | 438/435 |
| 6,750,117 B1 * | 6/2004 | Hung et al. | 438/437 |
| 6,770,689 B1 * | 8/2004 | Yoshimura et al. | 523/161 |
| 6,844,240 B2 * | 1/2005 | Park et al. | 438/424 |
| 6,849,520 B2 * | 2/2005 | Kim et al. | 438/424 |
| 2002/0127818 A1 * | 9/2002 | Lee et al. | 438/424 |
| 2004/0082143 A1 * | 4/2004 | Kim et al. | 438/424 |

* cited by examiner

METHOD FOR FORMING DEVICE ISOLATION FILM OF SEMICONDUCTOR DEVICE

BACKGROUND OF THE INVENTION

1. Field of the Invention

The present invention generally relates to a method for forming a device isolation film of a semiconductor device, and more specifically to a method for forming a device isolation film of a semiconductor device, wherein an annealing process is performed on the oxide film using $NH_3$ prior to the deposition of a liner nitride film and after the deposition of a thermal oxide film on a sidewall of a trench to nitridate the oxide film, whereby the characteristic of the interface between the oxide film and the liner nitride film, which serves as various defect sources is improved.

2. Description of the Prior Art

Generally, a conductive active region and a device isolation region for isolating devices are formed on a semiconductor substrate for a transistor or a capacitor.

A Local Oxidation of Silicon (LOCOS) process, which is a device isolation method has been suggested, wherein a device isolation region is formed by selectively growing a thick oxide film on a semiconductor substrate using a thermal oxidation method.

However, as semiconductor devices are required to have higher densities, reduction of the size of devices and insulation between devices became more difficult when the LOCOS process is used. In order to improve integration density and insulation properties of devices, a Shallow Trench Isolation (STI) process has been suggested.

In the STI process, a trench having a predetermined depth is formed on a semiconductor substrate and then filled with an oxide film which is an insulating material. The unnecessary portion of the oxide film is then etched by the CMP process to form a device isolation region on the semiconductor substrate.

FIGS. 1a through 1e are diagrams illustrating a conventional STI method for forming a device isolation film of a semiconductor device.

Figure 1A:
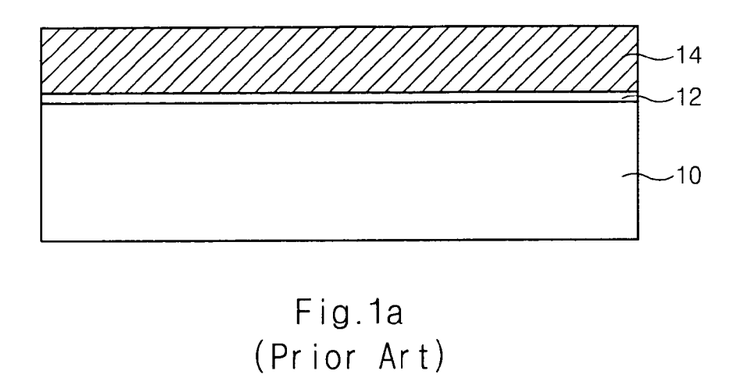
FIGS. 1a through 1e are cross-sectional diagrams illustrating a conventional STI method for forming a device isolation film of a semiconductor device.

Referring to FIG. 1a, a pad oxide film 12 is formed on a semiconductor substrate 10 by performing a thermal oxidation process. A pad nitride film 14, which is used as a mask in a subsequent trench etch process, is formed on the pad oxide film 12.

Figure 1B:
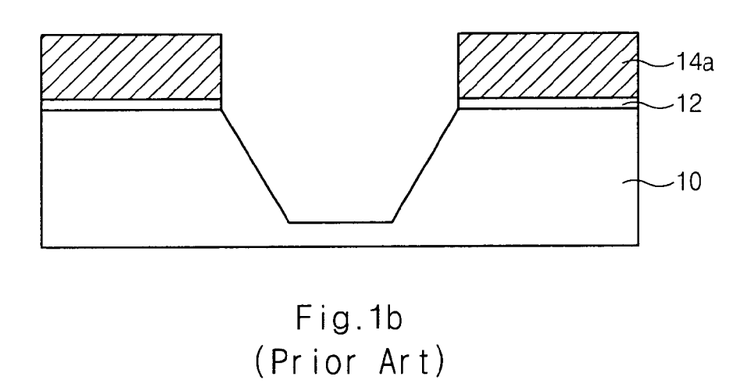

Referring to FIG. 1b, a nitride film pattern 14a is formed by selectively etching the pad nitride film 14 via photo-etching process using a device isolation mask (not shown). Then, a trench is formed on a predetermined region by etching the pad oxide film 12 and the semiconductor substrate 10 using the nitride film pattern 14a as a mask.

Figure 1C:
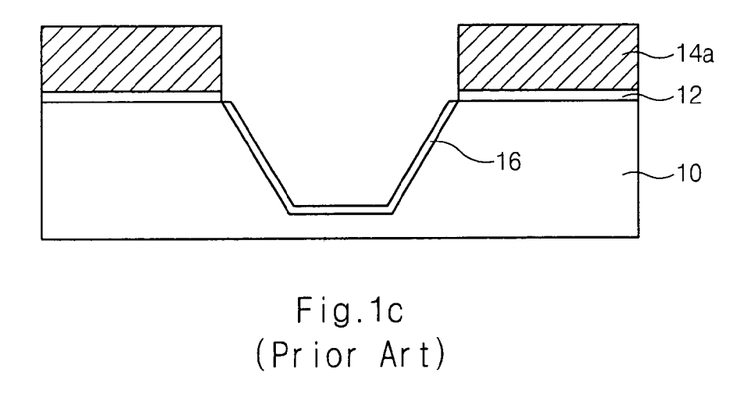

Referring to FIG. 1c, a thermal oxide film 16 is formed on a surface of the trench by performing a thermal oxidation process so as to remove a damage of the semiconductor substrate 10 caused by the etching process.

Figure 1D:
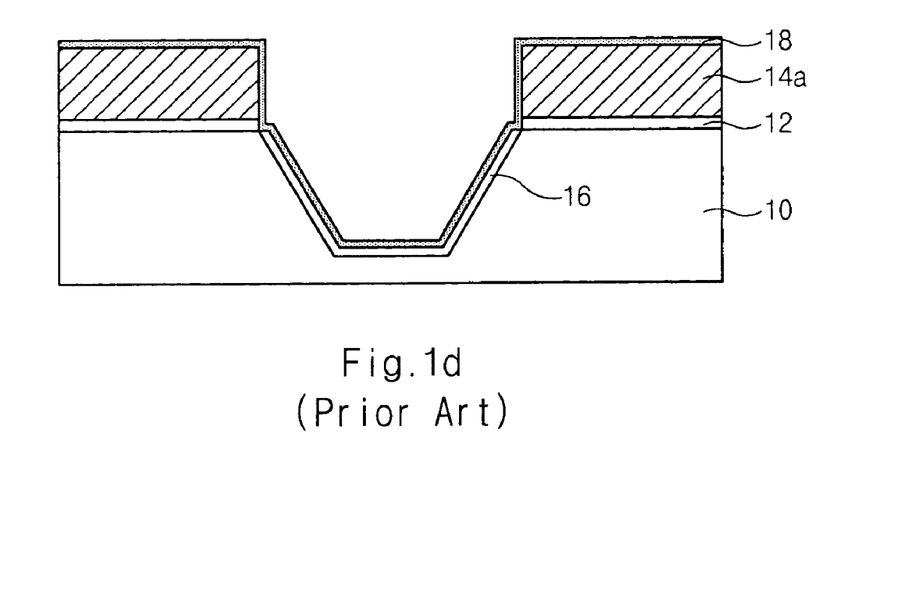

Referring to FIG. 1d, a liner nitride film 18 is formed on the entire surface of the resulting structure.

Figure 1E:
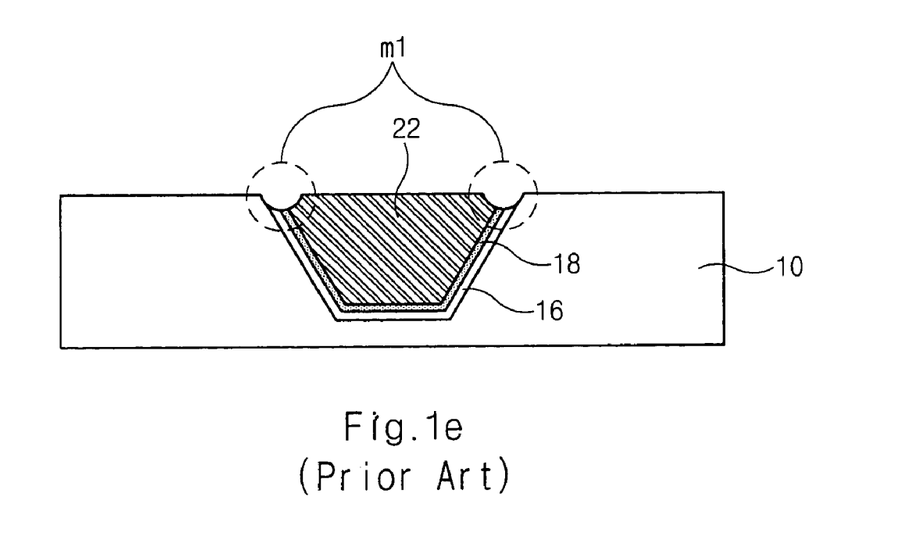

Referring to FIG. 1e, a HDP (high density plasma) oxide film, a PE-TEOS (plasma enhanced-tetraethyl ortho silicate) oxide film, an $O_3$-TEOS ($O_3$-tetraethyl ortho silicate) oxide film, an APL (advanced planarization layer) oxide film, a BPSG (borophospho silicate glass) oxide film or a PSG (phospho silicate glass) oxide film is deposited on the entire surface of resulting structure, and then planarized by performing a CMP process to form a STI-type device isolation film 22.

As shown in FIG. 1e, the conventional STI method results in a cave-in ("moat") the edges of the device isolation film (m1).

In the conventional STI method, liner nitride film is used to prevent oxidation of the silicon substrate during the subsequent process so as to improve the STI profile as well as reducing the electric field around a junction region.

However, when the liner nitride film is employed, the moat phenomenon, denoted as m1 of FIG. 1e, which causes a decrease in threshold voltage $V_t$ and an increase in leakage current occurs. In addition, the interface between the thermal oxide film and the liner nitride film on sidewalls of the trench serves as a defect source, resulting in hot electron trapping during a burn-in test. The hot electrons are easily excited by low electric field, and serve as sources of the leakage currents. As a result, a high electric field is formed in a PMOS drain region, thereby decreasing channel length and increasing the leakage current. This phenomenon is referred to as "hot carrier degradation", which has an adverse effect on the reliability of semiconductor devices.

Moreover it has been reported that the degradation due to the leakage current reduces the lifetime of semiconductor device.

SUMMARY OF THE INVENTION

It is an object of the present invention to provide a method for forming a device isolation film of a semiconductor device, wherein an annealing process is performed on the oxide film using $NH_3$ prior to the formation of a liner nitride film to improve the characteristic of an interface between the oxide film and the liner nitride film, thereby decreasing the leakage current generated due to the liner nitride film without affecting the refresh characteristics of the device.

It is another object of the present invention to provide a semiconductor device fabricated by the above-described method.

In order to achieve the above-described objects, there is provided a method for forming a device isolation film, comprising the steps of:

(a) sequentially forming a pad oxide film and a pad nitride film on a semiconductor substrate;

(b) selectively etching the pad nitride film to form a nitride film pattern;

(c) etching the pad oxide film and a predetermined thickness of the semiconductor substrate using the nitride film pattern as a hard mask to form a trench;

(d) forming a thermal oxide film on the surface of the trench;

(e) performing a annealing process under $NH_3$ atmosphere to form an oxide nitride film on the surface of the thermal oxide film;

(f) forming a liner nitride film on the entire surface;

(g) forming an oxide film filling the trench on the entire surface; and (h) performing a planarization process.

Preferably, the step (e) comprises a plasma $NH_3$ nitridation or a thermal $NH_3$ nitridation. Here, the step (d) is performed at a temperature ranging from 600 to 900° C., and under a pressure ranging from 5 mTorr to 200 Torr.

It is preferable that the steps (e) and (f) are performed under in-situ, in-chamber or cluster condition.

Preferably, the step (f) is performed in a LPCVD furnace or a LPCVD single chamber. Here, the step (f) is performed at a temperature ranging from 600 to 900° C., and under a pressure ranging from 0.1 to 10 Torr.

It is preferable that the step (f) is performed using one or more gases selected from the group consisting of $SiH_4$, $SiCl_4$ and $SiH_2Cl_2$ as silicon source gases, and using one or more gases selected from the group consisting of $NH_3$ and $N_2$ as nitrogen source gases. Here, the supply ratio of nitrogen source gas to silicon source gas is 1:1~20:1.

Preferably, the step (f) further comprises the step of forming a thermal oxide film on a liner nitride film and performing an annealing process.

There is also provided a semiconductor device fabricated by the above-described method.

DETAILED DESCRIPTION OF THE PREFERRED EMBODIMENTS

FIGS. 3a through 3f are cross-sectional diagrams illustrating method for forming device isolation film via a STI process of a semiconductor device according to the present invention.

Figure 3A:
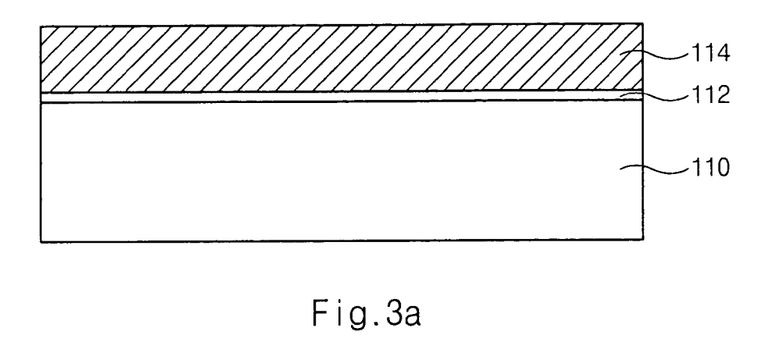
FIGS. 3a through 3f are cross-sectional diagrams illustrating method for forming device isolation film according to the present invention.

Referring to FIG. 3a, a pad oxide film 112 is formed on a semiconductor substrate 110 by performing a thermal oxidation process. A pad nitride film 114, which is used as a hard mask in a subsequent trench etch process, is formed on the pad oxide film 112.

Figure 3B:
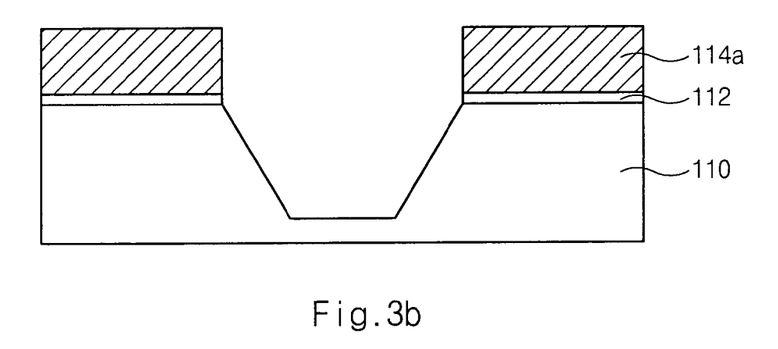

Referring to FIG. 3b, a nitride film pattern 114a is formed by selectively etching the pad nitride film 114 via photo-etching process using a device isolation mask (not shown). Then, a trench is formed on a predetermined region by etching the pad oxide film 112 and the semiconductor substrate 110 using the nitride film pattern 114a as a hard mask.

Figure 3C:
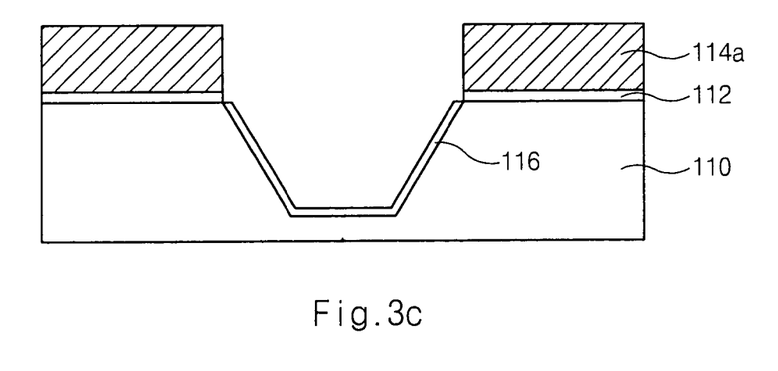

Referring to FIG. 3c, a thermal oxide film 116 is formed on a surface of the trench by performing a thermal oxidation process so as to remove a damage of the semiconductor substrate 110 caused by the etching process.

Figure 3D:
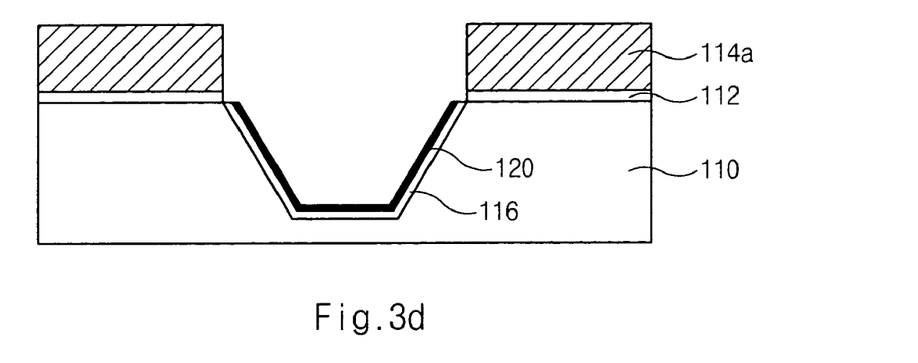

Referring to FIG. 3d, an oxide nitride film 120 is formed on the thermal oxide film 116 by performing an annealing process under $NH_3$ atmosphere.

Figure 3E:
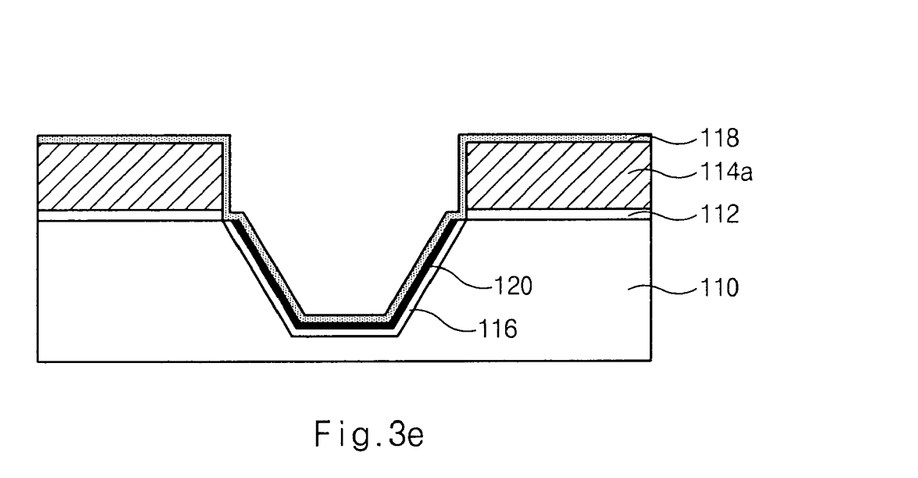

Referring to FIG. 3e, a liner nitride film 118 is formed on the entire surface of the resulting structure.

The annealing process is preferably a plasma $NH_3$ nitridation or a thermal $NH_3$ nitridation method performed at a temperature ranging from 600 to 900° C. and under a pressure ranging from 5 mTorr to 200 Torr.

The annealing process and the process for forming the liner nitride film 118 are preferably performed under an in-situ, in-chamber or cluster condition.

The process for forming the liner nitride film 118 is preferably performed in a LPCVD furnace or a LPCVD single chamber at a temperature ranging from 600 to 900° C. and under a pressure ranging from 0.1 Torr to 10 Torr.

The process for forming the liner nitride film 118 is preferably performed using one or more gases as selected from the group consisting of $SiH_4$, $SiCl_4$ and $SiH_2Cl_2$ as silicon source gases, and using one or more gases selected from the group consisting of $NH_3$ and $N_2$ as nitrogen source gases. The ratio of nitrogen source gas to silicon source gas is preferably 1:1~20:1.

A thermal oxide film (not shown) may be formed on the liner nitride film 118 and additional annealing process can be performed.

Figure 3F:
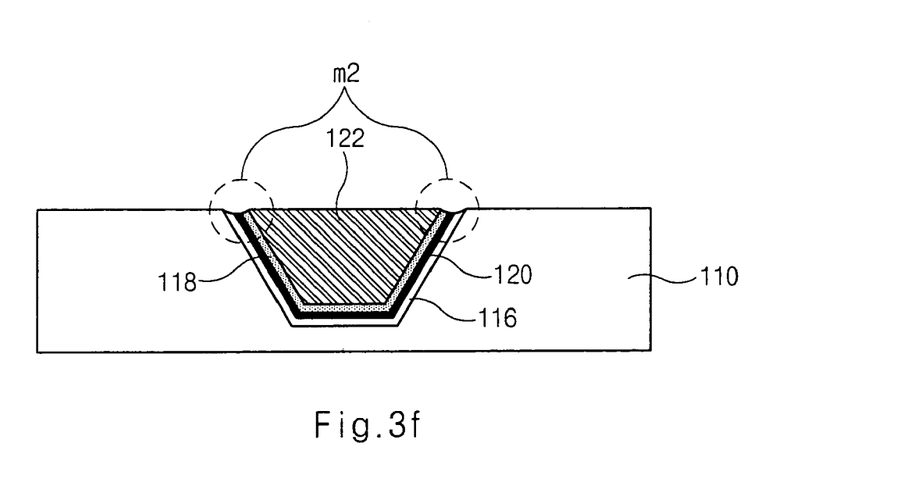

Referring to FIG. 3f, a HDP (high density plasma) oxide film, a PE-TEOS (plasma enhanced-tetraethyl ortho silicate) oxide film, an $O_3$-TEOS ($O_3$-tetraethyl ortho silicate) oxide film, an APL (advanced planarization layer) oxide film, a BPSG (borophospho silicate glass) oxide film or a PSG (phospho silicate glass) oxide film is deposited on the entire surface of resulting surface, and then planarized by performing a CMP process to form a STI-type device isolation film 122.

As shown in FIG. 3f, the depth of moat (m2) is remarkably reduced when the device isolation film is formed according to the present invention is performed.

COMPARATIVE EXAMPLE

Figure 2:
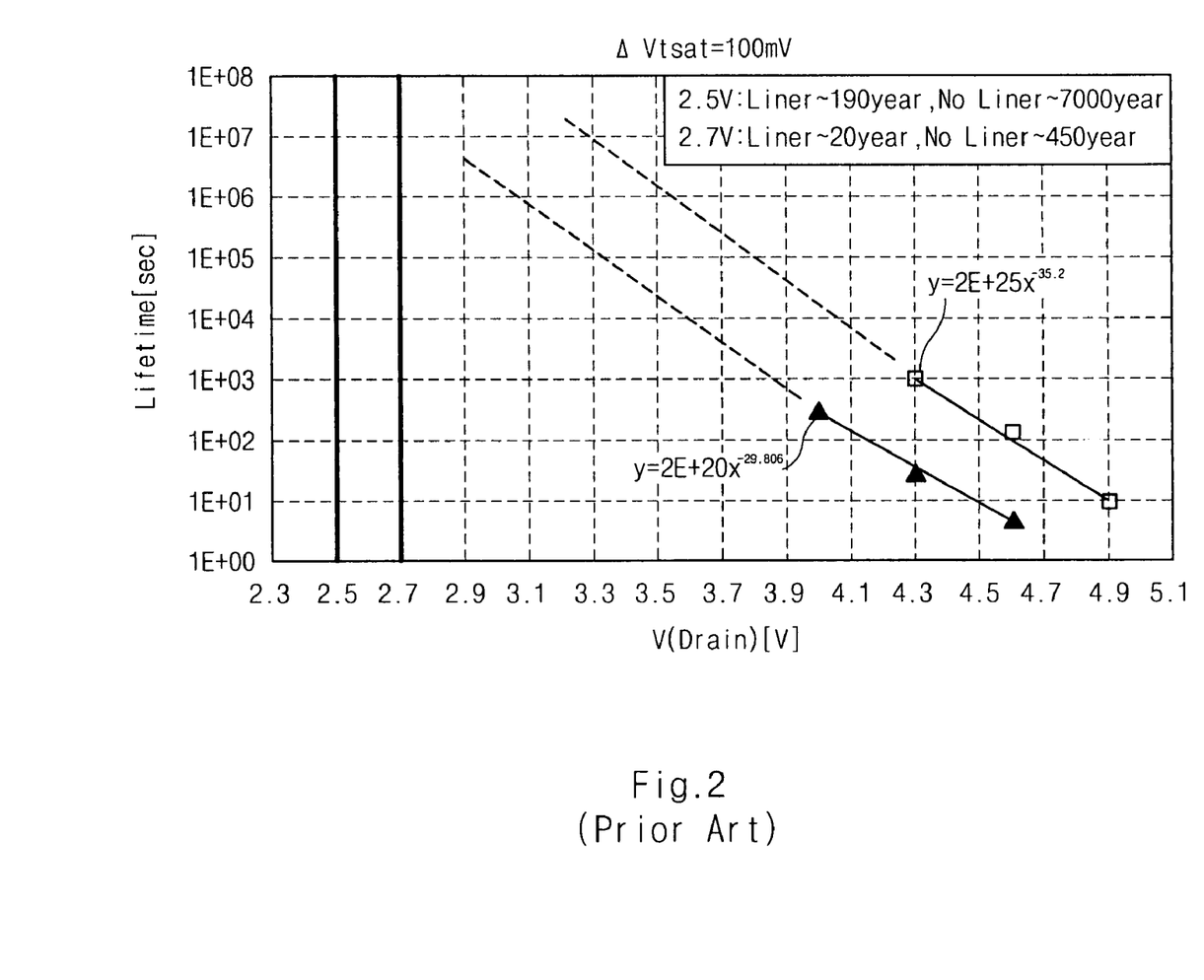
FIG. 2 is a graph illustrating variation in lifetime of device when a liner nitride film is employed in the device isolation film.

Measurement of Lifetime of Semiconductor Device with and Without Liner Nitride Film Variations in lifetime of device according to conditions of the formation of device isolation film is shown in FIG. 2. Referring to FIG. 2, ▲ denotes the lifetime in case a liner nitride film is formed without performing a $NH_3$ annealing process, and □ denotes the lifetime in case a liner nitride film is not formed at all. When Vd=2.5V, the lifetime in case the liner nitride film is formed is decreased to 190 years from 7000 in case the liner nitride film is not formed. When Vd=2.7V, the lifetime in case the liner nitride film is formed is decreased to 20 years from 450 years in case the liner nitride film is not formed.

Accordingly, when the liner nitride film is formed, the lifetime of a semiconductor device is highly reduced than when the liner nitride film is not formed.

Example 1

Figure 4:
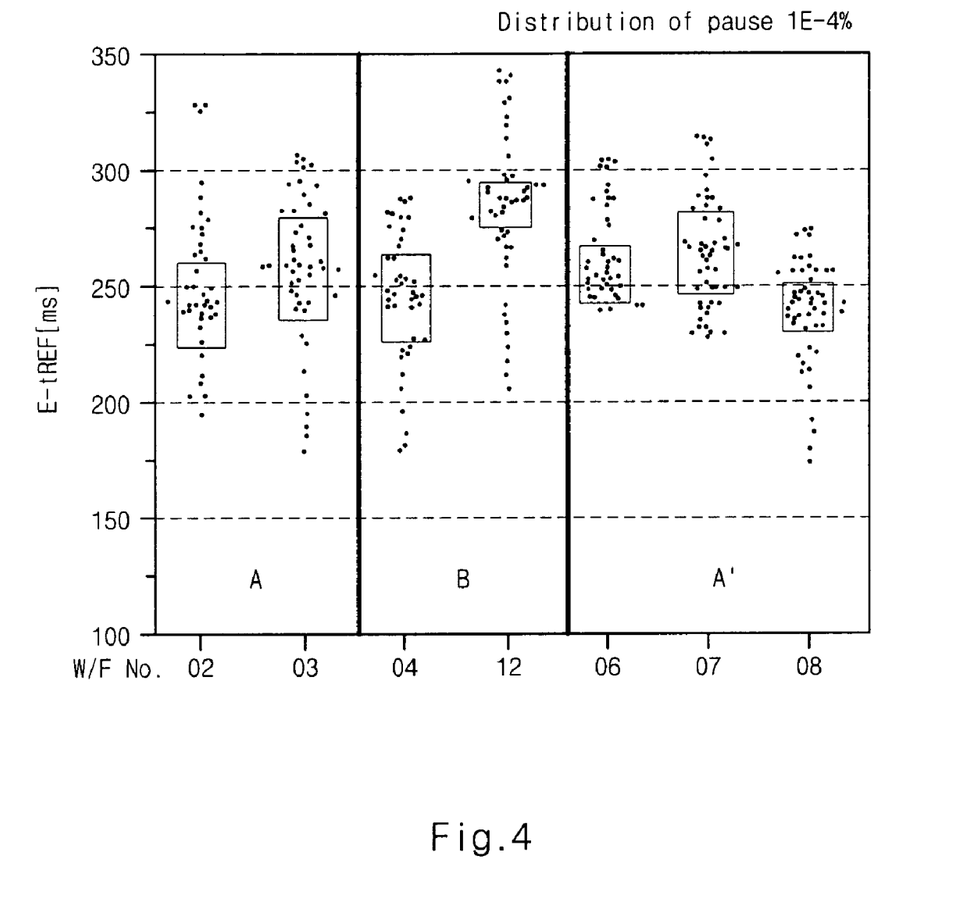
FIG. 4 is a graph illustrating a refresh characteristic when $NH_3$ annealing process is performed according to the present invention.

Refresh Characteristics of the Semiconductor Device with and Without $NH_3$ Annealing Process Referring to FIG. 4, sections A and A' represent refresh time of a semiconductor device with $NH_3$ annealing treatment according to the present invention prior to the formation of a liner nitride film. Section B represents a refresh time of the semiconductor device without a $NH_3$ annealing process prior to the formation of liner nitride film. As shown FIG. 4, the refresh characteristics are not degraded regardless of the $NH_3$ annealing process.

Example 2

Leakage Current Characteristics with or Without $NH_3$ Annealing Process

Figure 5:
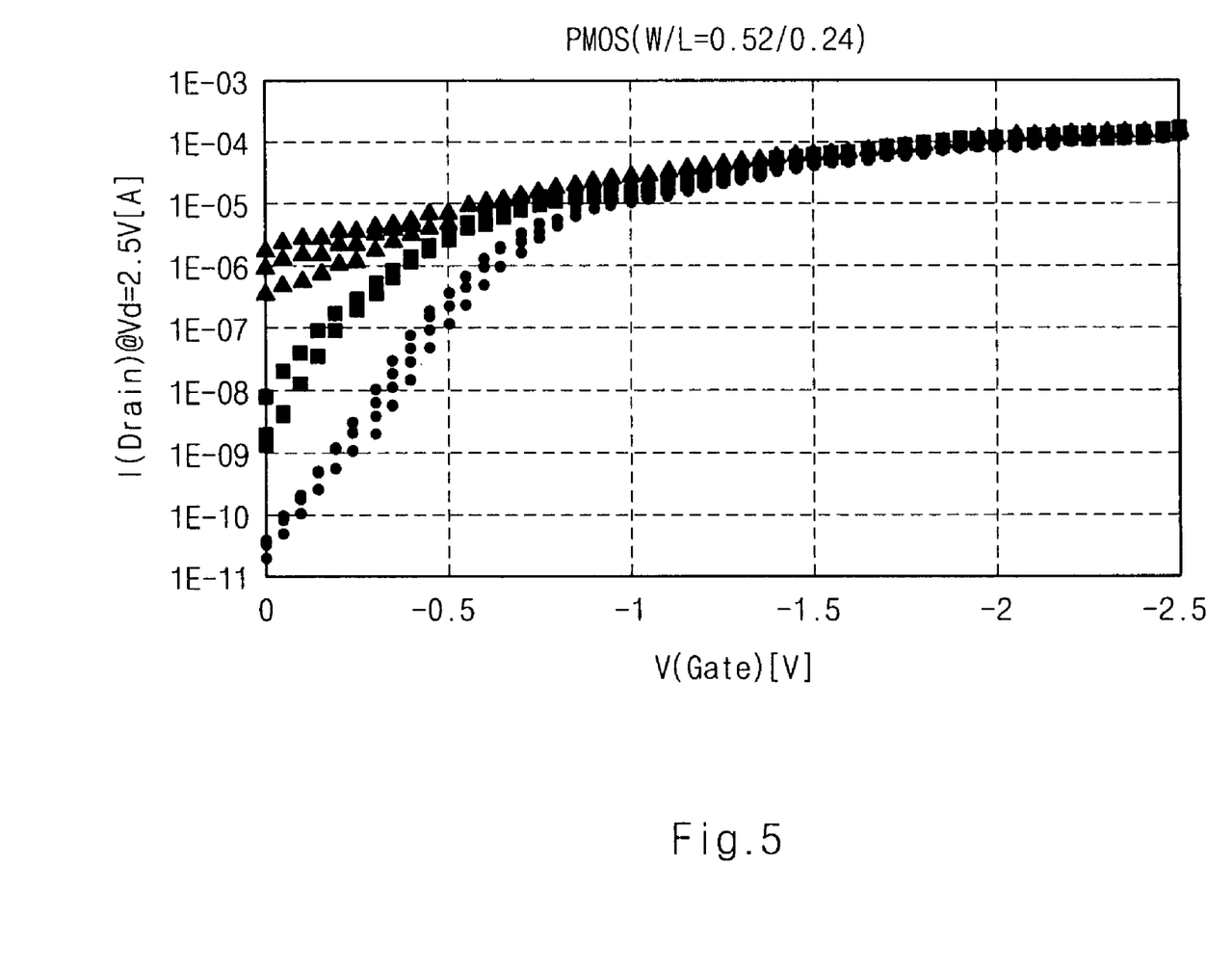
FIG. 5 is a graph illustrating a leakage current when $NH_3$ annealing process is performed according to the present invention.

Referring to FIG. 5, (1) ▲ represents the leakage currents in case the liner nitride film is formed without the $NH_3$ annealing process; (2) ■ represents the leakage currents in case the liner nitride film is not formed at all; and (3) ■ represents the leakage currents in case $NH_3$ annealing process is performed prior to the formation of the liner nitride film. The leakage currents in (1), (2) and (3) is measured under a stress condition of Vd=4.8V, Vg=Gate Current Max and 2000 sec. On the other hand, represents the leakage currents in case no stress is applied to the device formed according to (1), (2) and (3).

As shown in FIG. 5, when a stress is not applied, the leakage currents of (1), (2) and (3) have the same value. When a stress is applied, the leakage current value of (1) is the greatest while the leakage current values of (2) and (3) are almost the same.

As discussed earlier, according to the present invention, an annealing process is performed on the oxide film using $NH_3$ prior to the formation of a liner nitride film to improve the characteristic of an interface between the oxide film and the liner nitride film, thereby decreasing the leakage current generated due to the liner nitride film without affecting the refresh characteristics of the device. Accordingly, the degradation of a device is prevented.

What is claimed is:

1. A method for forming a device isolation film, comprising the steps of:
    (a) sequentially forming a pad oxide film and a pad nitride film on a semiconductor substrate;
    (b) selectively etching the pad nitride film to form a nitride film pattern;
    (c) etching the pad oxide film and a predetermined thickness of the semiconductor substrate using the nitride film pattern as a hard mask to form a trench;
    (d) forming a thermal oxide film on the surface of the trench;
    (e) performing an annealing process under $NH_3$ atmosphere to form an oxide nitride film on the surface of the thermal oxide film;
    (f) forming a liner nitride film on the oxide nitride film and the pad nitride film to improve interface characteristic between the thermal oxide film and said liner nitride film;
    (g) forming an oxide film filling the trench on the entire surface; and
    (h) performing a planarization process.

2. The method according to claim 1, wherein the step (e) comprises a plasma $NH_3$ nitridation or a thermal $NH_3$ nitridation.

3. The method according to claim 1, wherein the step (e) is performed at a temperature ranging from 600 to 900° C.

4. The method according to claim 1, wherein the step (e) is performed at a pressure ranging from 5 mTorr to 200 Torr.

5. The method according to claim 1, wherein the steps (e) and (f) are performed under in-situ, in-chamber or cluster condition.

6. The method according to claim 1, wherein the step (f) is performed in a LPCVD furnace or a LPCVD single chamber.

7. The method according to claim 6, wherein the step (f) is performed at a temperature ranging from 600 to 900° C.

8. The method according to claim 6, wherein the step (f) is performed at a pressure ranging from 0.1 to 10 Torr.

9. The method according to claim 6, wherein the step (f) is performed using one or more gases selected from the group consisting of $SiH_4$, $SiCl_4$ and $SiH_2Cl_2$ as silicon source gases, and using one or more gases selected from the group consisting of $NH_3$ and $N_2$ as nitrogen source gases.

10. The method according to claim 9, wherein the supply ratio of nitrogen source gas to silicon source gas is 1:1~20:1.

11. The method according to claim 1, wherein the step (f) further comprises the step of forming a thermal oxide film on said liner nitride film and performing an additional annealing process.

* * * * *